(12) United States Patent
Kim

(10) Patent No.: US 9,822,256 B2
(45) Date of Patent: Nov. 21, 2017

(54) INORGANIC PAINT COMPOSITION AND METHOD FOR FORMING INORGANIC PAINT FILM BY USING THE SAME

(71) Applicant: Hyo Weon Kim, Seongnam-si, Gyeonggi-do (KR)

(72) Inventor: Hee Gon Kim, Daejeon (KR)

(73) Assignee: Hyo Weon Kim, Daejeon (KR)

( * ) Notice: Subject to any disclaimer, the term of this patent is extended or adjusted under 35 U.S.C. 154(b) by 150 days.

(21) Appl. No.: 14/443,410

(22) PCT Filed: Nov. 15, 2013

(86) PCT No.: PCT/KR2013/010426
§ 371 (c)(1),
(2) Date: May 18, 2015

(87) PCT Pub. No.: WO2014/077632
PCT Pub. Date: May 22, 2014

(65) Prior Publication Data
US 2015/0291801 A1   Oct. 15, 2015

(30) Foreign Application Priority Data

Nov. 16, 2012 (KR) .................. 10-2012-0130126
Nov. 14, 2013 (KR) .................. 10-2013-0138103

(51) Int. Cl.
| | | |
|---|---|---|
| C09D 1/02 | (2006.01) | |
| C09D 5/08 | (2006.01) | |
| B05D 1/00 | (2006.01) | |
| B05D 1/02 | (2006.01) | |
| B05D 1/18 | (2006.01) | |
| B05D 1/28 | (2006.01) | |
| B05D 1/30 | (2006.01) | |
| C23C 14/48 | (2006.01) | |
| C23C 16/50 | (2006.01) | |

(52) U.S. Cl.
CPC ............... *C09D 1/02* (2013.01); *B05D 1/005* (2013.01); *B05D 1/02* (2013.01); *B05D 1/18* (2013.01); *B05D 1/28* (2013.01); *B05D 1/305* (2013.01); *C09D 5/08* (2013.01); *C23C 14/48* (2013.01); *C23C 16/50* (2013.01)

(58) Field of Classification Search
CPC . C09D 1/02; C09D 5/08; B05D 1/005; B05D 1/02; B05D 1/18; B05D 1/28; B05D 1/305; C23C 14/48; C23C 16/50
See application file for complete search history.

(56) References Cited

FOREIGN PATENT DOCUMENTS

| | | | |
|---|---|---|---|
| CN | 102002697 A | * | 4/2011 |
| DE | DD 256055 A3 | * | 4/1988 |
| EP | 2660220 A1 | * | 11/2013 |
| KR | 10-0235093 B1 | | 12/1999 |
| KR | 10-2000-0002219 A | | 1/2000 |
| KR | 10-2005-0112633 A | | 12/2005 |
| KR | 10-2011-0012682 A | | 2/2011 |
| KR | 10-2011-0046214 A | | 5/2011 |
| KR | 10-2004-0060874 A | | 7/2014 |
| WO | WO 2012/089874 A1 | * | 7/2012 |

* cited by examiner

Primary Examiner — Anthony J Green
(74) Attorney, Agent, or Firm — Novick, Kim & Lee PLLC; Jae Youn Kim

(57) ABSTRACT

The present invention relates to an inorganic paint composition, and a method for forming an inorganic paint film by using the same. The inorganic paint composition comprises: at least one alkali metal silicates represented by the following chemical formulas 1-3; phosphoric acid ($H_3PO_4$); one or more strong bases selected from KOH, NaOH and LiOH; and water ($H_2O$) (In chemical formulas 1-3, x and y are 0.01-500, and n is a natural number of 1-20). [Chemical formula 1] $xNa_2O \cdot ySiO_2 \cdot nH_2O$, [Chemical formula 2] $xK_2O \cdot ySiO_2 \cdot nH_2O$, and [Chemical formula 3] $xLi_2O \cdot ySiO_2 \cdot nH_2O$. An inorganic coating film formed using the inorganic paint composition of the present invention has a strong binding force, regardless of the kinds of base materials, and thus shows excellent adhesion, adherence and the like to the base material and is not separated from the base material even after a long time.

7 Claims, 8 Drawing Sheets

INORGANIC PAINT COMPOSITION AND METHOD FOR FORMING INORGANIC PAINT FILM BY USING THE SAME

TECHNICAL FIELD

The present invention relates to an inorganic paint composition and a method for forming an inorganic paint film by using the same.

BACKGROUND ART

In general, paints are very widely used in homes including kitchens, living rooms, etc. as well as all sorts of industrial fields including railroads, vehicles, ships, road facilities, electronics, electricity, etc.

However, the conventional organic paints using organic solvents, such as alcohol, etc., have the problem of environmental contamination. In the case where organic substances (for example, all kinds of oils, lacquer sprays, oil markers, etc.) stain and pollute the surfaces of conventional organic paints, it is not easy to remove the stain since the surfaces faces of organic paints are hydrophilic and thus combine easily with the organic substances.

Furthermore, organic paints have weak adhesive properties and adherence to adhere to the surfaces of metals and nonferrous metals. To coat organic paints on the surfaces of the metals and nonferrous metals, additional processes are required, such as pretreatments of sanding or acidizing the surfaces thereof or coating the surfaces thereof with a special substance having high adhesion. The coating processes are complicated and costs increase. In addition, if the service life is long or an external impact is applied, organic paints often peel away from the basic materials.

Organic paints also have the problems of being weak at a high temperature and being easily combustible. So, paints and coating agents to replace such organic paints have been continuously demanded.

To solve the aforementioned problems, an inorganic coating composition has been developed by using water soluble silicate and aluminum or using water soluble silicate prepared by aluminum metallic oxide as the main ingredients. However, since the water soluble modified silicate used as a binder in this inorganic coating composition is a strong alkali substance, after a coating film is formed, a small amount of an alkali element leaches out to the surface of the coating film, causing efflorescence.

A study has been also made on a hydrophilic inorganic paint composition having alkali metallic oxide and alkali silicate as a curing agent and metallic oxide, metallic phosphate and alkali silicate as a base. However, efflorescence caused by alkali leaching has not been completely prevented in this case. Further, water-proofing is not perfect and the adhesion or adherence to the basic materials needs to be improved.

RELATED ART DOCUMENT (Patent Document 1): Korean Patent No. 10-0235093

DETAILED DESCRIPTION OF THE INVENTION

Technical Problem

Therefore, it is an object of the present invention to solve the aforementioned problems of the conventional art and to provide an inorganic paint composition, wherein, when it is coated onto a basic material, a contaminant can be easily removed by the water, has high heat-resistance and incombustibility, can be applied by a simple coating method, regardless of the kinds of basic materials, and has excellent adhesion or adherence to the basic material.

It is another object of the present invention to provide a method for forming an inorganic paint film on a basic material, by using the inorganic paint composition.

Technical Solution

In accordance with an embodiment of the present invention, there is provided an inorganic paint composition comprising: at least one or more alkali metal silicates represented by Formulas 1 to 3 below; phosphoric acid ($H_3PO_4$); any one or more strong bases selected from KOH, NaOH and LiOH; and water ($H_2O$)

$$x\mathrm{Na_2O}.y\mathrm{SiO_2}.n\mathrm{H_2O} \quad \text{[Formula 1]}$$

$$x\mathrm{K_2O}.y\mathrm{SiO_2}.n\mathrm{H_2O} \quad \text{[Formula 2]}$$

$$x\mathrm{Li_2O}.y\mathrm{SiO_2}.n\mathrm{H_2O} \quad \text{[Formula 3]}$$

In Formulas 1 to 3, x and y are 0.01~500, respectively and n is a natural number of 1~20.

The inorganic paint composition may comprise: 25~95 wt. % of the at least one or more alkali metal silicates represented by Formulas 1 to 3 above; 0.1~1 wt. % of the phosphoric acid ($H_3PO_4$), 0.5~5 wt. % of the strong base(s); and 4~84 wt. % of the water ($H_2O$), based on 100 wt. % of the inorganic paint composition.

The alkali metal silicates represented by Formulas 1 to 3 above may be 12~40 wt. %, 1~30 wt. % and 12~40 wt. %, respectively, based on 100 wt. % of the inorganic paint composition.

The alkali metal silicates represented by Formulas 1 to 3 above may include 25~50%, 15~40% and 10~35% of solids content, respectively.

The inorganic paint composition may have a pH of 8~14.

The inorganic paint composition may form a coating film which is 9H in pencil hardness measured according to the standard of ASTM D3363, 5B in adhesion measured according to the standard of ASTM D3359, and 30.7 degrees or less in a contact angle between the coating film and water after putting one drop of the water on the coating film.

When the inorganic paint composition forms the coating film on a surface of a basic material, the surface of the basic material is not corroded after it is exposed to a strong acid of 10% in concentration, such as hydrochloride acid, sulfuric acid or nitric acid, for 48 hours or more. But, in the case where the basic material, such as an organic material, polymer material, aluminum or steel, is weakened by corrosion, the resistance to the strong acid differs from a few minutes to a number of minutes. The coating film formed on stainless steel or titanium which is a material which is more corrosion-resistant at a certain standard has corrosion-resistant properties for a number of hours to hundreds of hours.

When the inorganic paint composition is used to coat glass, the reflectance of the coated glass may decrease by 1~3% compared with the uncoated glass and the transmittance of the coated glass may increase by 1~3% compared with the uncoated glass.

In accordance with another embodiment of the present invention, there is provided a method for forming an inorganic paint film using an inorganic paint composition, comprising the steps of: a) mixing and agitating at least one or more alkali metal silicates represented by Formulas 1 to 3 below; phosphoric acid ($H_3PO_4$); any one or more strong bases selected from KOH, NaOH and LiOH; and water ($H_2O$); b) preheating a basic material; c) coating the surface of the basic material with the inorganic paint composition; and d) performing plastic-working of the dried basic material.

$$xNa_2O.ySiO_2.nH_2O \quad \text{[Formula 1]}$$

$$xK_2O.ySiO_2.nH_2O \quad \text{[Formula 2]}$$

$$xLi_2O.ySiO_2.nH_2O \quad \text{[Formula 3]}$$

In Formulas 1 to 3, x and y are 0.01~500, respectively and n is a natural number of 1~20.

Step b) may further comprise: pretreatment using any one of the ways to remove impurities, such as plasmatizing, anodizing, sanding, etching, and cleaning to remove grease on the surface of the basic material, so that the basic material is hydrophilic.

The method for forming an inorganic paint film may further comprise a step of drying the coated basic material at room temperature or at a higher temperature prior to step d).

Step b) may be a preheat process at a temperature of 50±10° C.

Step a) of the preparation of the inorganic paint composition may be performed to have a pH in the range of 8~14.

The inorganic paint composition prepared in step a) may comprise: 25~95 wt. % of the at least one or more alkali metal silicates represented by Formulas 1 to 3 above; 0.1~1 wt. % of the phosphoric acid ($H_3PO_4$), 0.5~5 wt. % of the strong base(s); and 4~84 wt. % of the water ($H_2O$), based on 100 wt. % of the inorganic paint composition.

The alkali metal silicates represented by Formulas 1 to 3 above may be 12~40 wt. %, 1~30 wt. % and 12~40 wt. %, respectively, based on 100 wt. % of the inorganic paint composition.

The alkali metal silicates represented by Formulas 1 to 3 above may include 25~50%, 15~40% and 10~35% of solids content, respectively.

In step d), the plastic-working of the dried basic material may be performed at room temperature ~450° C. for a number of minutes to a number of hours, and a plastic-working time may vary according to the conditions of plastic-working equipment. If a predetermined temperature of the plastic-working equipment can be maintained for a long time, the plastic-working is performed for a short time. However, if it is difficult to maintain the predetermined temperature of the plastic-working equipment, the plastic-working process requires for a long time. In the case where a plastic-working temperature is 250±50° C. and the plastic-working equipment is an enclosed chamber type such as an electric furnace or kiln, a lot of electricity and maintenance expenses are incurred to keep the temperature of 250±50° C. Therefore, it is efficient to form the inorganic paint film through heating (temperature rising), staying and cooling processes upon the plastic-working. It definitely needs the heating process when a plastic-working furnace first operates and the cooling process when the plastic-working furnace stops. A total time of the plastic-working requires about 1~3 hours. However, after the plastic-working furnace operates, the temperature is efficiently controllable for the plastic-working and the plastic-working is possible for 1 hour or less. In the case where, among diverse heat sources, the general energy, such as electricity, gas, etc., is used as a heat source, a lot of time is required for initial heating.

However, when a special plastic-working furnace, such as the plastic-working furnace using microwave, is used, heating is possible within a few minutes to a number of minutes, to shorten the plastic-working time. In the case where the plastic-working equipment in a conveyor type is used, since it is possible to maintain a high temperature by section, the inorganic paint film can be formed after the plastic-working is performed within a few minutes to a number of minutes. Based on experiments, the most optimal time is within 10~30 minutes. When the plastic-working temperature is at room temperature or under 170° C., heat energy is not sufficient and therefore temperature is in inverse proportion to time upon the plastic-working (drying). When the basic material is coated at room temperature, it may need more than a number of hours. As the temperature for the plastic-working (drying) rises, the time thereof is reduced and therefore the inorganic paint film is formed by the plastic-working for a few hours at 100° C. or higher. However, when the inorganic paint film is formed by the plastic-working (drying) at a low temperature, the hardness of the inorganic paint film by a pencil hardness test, the adhesion and pollution-resistance thereof are good but the water proofing thereof is weaker than the inorganic paint film formed by the plastic-working at 250° C. or higher. Therefore, the inorganic paint film formed by the plastic-working (drying) at a low temperature is able to be used in the area requiring the features of scratch-resistance and contamination prevention, except for the area exposed to water for a long time.

Step c) of coating the surface of the basic material with the inorganic paint composition may use any one selected from a dipping coating method, a spray coating method, a roll coating method, a spin coating method, a bar coating method, a flow coating method, a curtain coating method, a knife coating method, a vacuum deposition method, an ion plating method, and a plasma vapor deposition method.

In step c), the inorganic paint composition may be coated on the surface of the basic material at a thickness of 0.01~30 μm.

In step a), a first composition may be prepared by comprising at least one or more alkali metal silicates represented by Formulas 1 to 3, the strong base(s) and water ($H_2O$) and a second composition may be prepared by comprising at least one or more alkali metal silicates represented by Formulas 1 to 3, the strong base(s) and water ($H_2O$), and then the first composition and the second composition may be mixed at a ratio of 1:1 and agitated.

The first composition may comprise: 0.1~1 wt. % of the phosphoric acid ($H_3PO_4$), 0.001~49 wt. % of the at least one or more alkali metal silicates represented by Formulas 1 to 3 above; 0.5~5 wt. % of the strong base; and 1~50 wt. % of the water ($H_2O$), based on 100 wt. % of the total inorganic paint composition, and the second composition may comprise: 12~69 wt. % of the at least one or more alkali metal silicates represented by Formulas 1 to 3 above; 0.5~5 wt. % of the strong base; and 1~85 wt. % of the water ($H_2O$), based on 100 wt. % of the total inorganic paint composition.

In accordance with another embodiment of the present invention, there is provided a method for forming an inorganic paint film, comprising the steps of: a) mixing and agitating an inorganic paint composition; b) coating a surface of a basic material with the inorganic paint composition; and c) performing plastic-working of the basic material coated with the inorganic paint composition by radiating microwaves, wherein the inorganic paint composition comprises: at least one or more alkali metal silicates represented by Formulas 1 to 3 below; phosphoric acid ($H_3PO_4$); any one or more strong bases selected from KOH, NaOH and LiOH; and water ($H_2O$).

$$xNa_2O \cdot ySiO_2 \cdot nH_2O \quad \text{[Formula 1]}$$

$$xK_2O \cdot ySiO_2 \cdot nH_2O \quad \text{[Formula 2]}$$

$$xLi_2O \cdot ySiO_2 \cdot nH_2O \quad \text{[Formula 3]}$$

In Formulas 1 to 3, x and y are 0.01~500, respectively and n is a natural number of 1~20.

The inorganic paint composition may comprise: 25~95 wt. % of the at least one or more alkali metal silicates represented by Formulas 1 to 3 above; 0.1~1 wt. % of the phosphoric acid ($H_3PO_4$), 0.5~5 wt. % of the strong base(s); and 4~84 wt. % of the water ($H_2O$), based on 100 wt. % of the inorganic paint composition.

The alkali metal silicates represented by Formulas 1 to 3 above may be 12~40 wt. %, 1~30 wt. % and 12~40 wt. %, respectively, based on 100 wt. % of the inorganic paint composition.

The microwaves may be 2400 MHz~2500 MHz in frequency.

The microwaves may be 2450 MHz in frequency.

The microwaves may intermittently radiate at an interval of 50~1200 seconds for the plastic-working.

The microwaves may continuously radiate for the plastic-working

The microwaves may intermittently radiate at an interval of 30~120 seconds for the plastic-working.

Step c) of performing the plastic-working of the basic material coated with the inorganic paint composition by radiating the microwaves may be performed with a process of cooling the bottom of the basic material.

The process of cooling the bottom of the basic material may be performed by air-cooling or water-cooling.

Step b) of coating the surface of the basic material with the inorganic paint composition may further comprise: a step of pre-treating the surface of the basic material before coating with the inorganic paint composition.

The step of pre-treating the surface of the basic material may further comprise: a step of removing impurities by cleaning to remove grease on the surface of the basic material or a step of performing a surface treatment to improve the surface of the basic material.

Step b) may be performed after performing the preheat treatment to the surface of the basic material at 60±30° C.

Step b) may be performed before performing the preheat treatment to the surface of the basic material at 60±30° C.

Step c) may be performed to the surface of the basic material coated with the inorganic paint composition at a thickness of 0.01~50 μm.

The method of forming the inorganic paint film may further comprise: a step of adding an UV cure after step c).

The step c) may be performed on the surface of the basic material coated with the inorganic paint composition, by controlling a radiation time using a portable microwave radiator.

The radiation time using microwaves may be under 30 minutes.

Step b) may further comprise: a step of performing a pretreatment to remove impurities by controlling the roughness of the surface of the basic material or cleaning to remove grease on the surface thereof before the surface thereof is coated.

Step b) may be performed after performing the preheat treatment to the surface of the basic material at 60±30° C.

Step c) may be performed on the surface of the basic material coated with the inorganic paint composition at a thickness of 0.150 μm.

The method of forming the inorganic paint film may further comprise: a step of adding an UV cure after step c).

Advantageous Effects

The inorganic coating film formed by using the inorganic paint composition according to the present invention has a strong binding power with the surfaces of, especially, metal materials and nonmetallic materials, regardless of the kinds of basic materials. Therefore, the adhesion or adherence to the basic materials is excellent and the film does not fall off from the basic materials even though a long time passes.

Further, the inorganic coating film is hydrophilic and therefore has a weak binding power with organic materials, etc. so that organic contaminant substances do not adhere well. Since organic substances and the other contaminating substances are easily removed from the film, these are easily removed by only applying water to the surface of the film, without any additional work.

Furthermore, the inorganic paint composition and the inorganic coating film are excellent in weatherproof, durability, chemical resistance, abrasion-resistance, hardness of the surface, far-infrared radiation, incombustibility, corrosion-resistance and antibiotic action.

Additionally, since water is used as a solvent, no contaminating substances occur during the processes of preparing the inorganic paint composition and coating with the same. Therefore, the inorganic paint composition and the film formed by using the same are eco-friendly and semi-permanent in lifespan.

MODES FOR CARRYING OUT THE INVENTION

Figure 1:
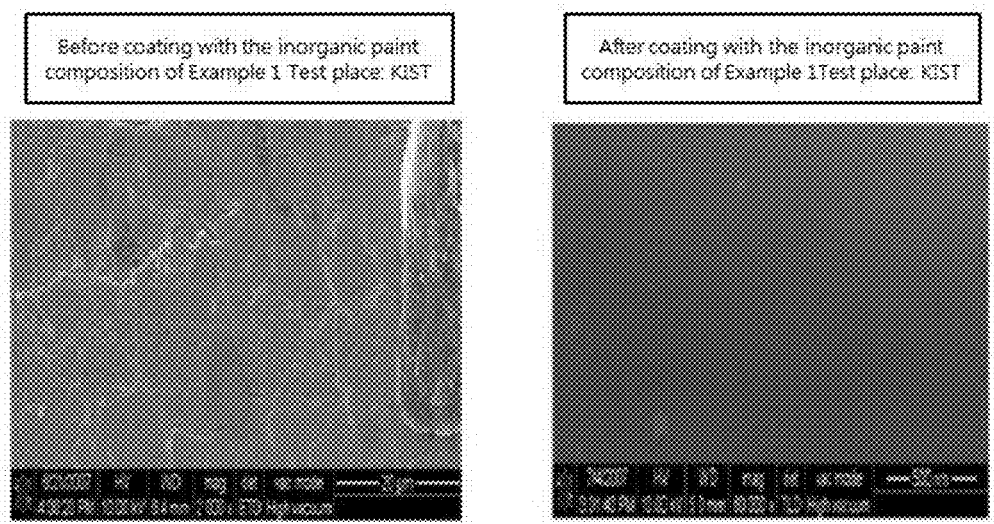
FIG. 1 shows SEM pictures of a surface of a basic material with an inorganic coating film according to the present invention.

An inorganic paint composition and a method for forming an inorganic paint film using the same according to the present invention will be fully described.

The inorganic paint composition of the present invention comprises: at least one or more alkali metal silicates represented by Formulas 1 to 3 below; phosphoric acid ($H_3PO_4$); any one or more strong bases selected from KOH, NaOH and LiOH; and water ($H_2O$), $$xNa_2O \cdot ySiO_2 \cdot nH_2O \quad \text{[Formula 1]}$$

$$xK_2O \cdot ySiO_2 \cdot nH_2O \quad \text{[Formula 2]}$$

$$xLi_2O \cdot ySiO_2 \cdot nH_2O \quad \text{[Formula 3]}$$

In Formulas 1 to 3, x and y are 0.01~500, respectively, (preferably, a ratio of x and y is 1:1.9~500), and n is a natural number of 1~20.

As shown in Formulas 1 to 3, the alkali metal silicate is composed of a complex compound. That is, it is a chemical species formed by combining some nonmetallic atoms or atomic groups around one or more atoms of lithium, sodium and potassium. A nonmetallic element is substituted for a central metal atom, so that a single bond between silicon (Si) and another atom is made as a double bond, generating a network structure. This is a mechanism in that hydroxyl ion (—OH) attached to silicate is substituted and dissociated as an ion by a condensation reaction with the silicate, thereby preventing the penetration of water and improving water-resistance.

The alkali metal silicates represented by Formulas 1 to 3 of the present invention are liquid materials, that is, sodium silicate hydrate, potassium silicate hydrate and lithium silicate hydrate.

The solids content included in the alkali metal silicate hydrates represented in Formulas 1 to 3 may be 25~50%, 15~40% and 10~35%, respectively.

Since the inorganic paint composition includes the alkali metal silicate hydrates which are in the ranges of the solids content as described above, it has fast and high reaction efficiency with the other constituent elements upon preparation. Stability is improved even after the preparation.

The inorganic paint composition may comprise one or two or three of the sodium silicate hydrates, potassium silicate hydrate and lithium silicate hydrate represented by Formulas 1 to 3. That is, the inorganic paint composition of the present invention may comprise at least one of the silicate hydrates represented by Formulas 1 to 3, thereby increasing the adhesion or adherence to a basic material and improving dirt-resistance and water-resistance of a coating film by using the inorganic paint composition.

The alkali metal silicate included in the inorganic paint composition may be 25~95 wt. %, based on the total weight of the inorganic paint composition (that is, based on 100 wt. % of the inorganic paint composition). When the inorganic paint composition includes the alkali metal silicate in the range of less than 25 wt. %, it is impossible to obtain any desirable effects in the capability of removing a pollutant, hardness and corrosion-resistance of the inorganic paint composition. When the inorganic paint composition includes the alkali metal silicate in the range of more than 95 wt. %, it may have a problem in the adhesion or adherence to the basic material.

In the case where the inorganic paint composition includes all of the alkali metal silicates of Formulas 1 to 3, the sodium silicate hydrate of Formula 1 may be 12~40 wt. %, the potassium silicate hydrate of Formula 2 may be 1~30 wt. %, and the lithium silicate hydrate of Formula 3 may be 12~40 wt. %, based on 100 wt. % of the inorganic paint composition.

In the case where the composition ratio of the compounds according to Formulas 1 to 3 forming the alkali metal silicates falls within the aforementioned ranges, the effects of the present invention are greatly improved in the bonding power with the basic material, corrosion-resistance, dirt-resistance, high hardness, heat-resistance, etc. However, when the amount of added water is less than the preferred content thereof, a crack may occur in the film of the inorganic paint composition formed on the surface of the basic material.

The present invention does not specially limit a method for preparing the alkali metal silicate hydrates represented by Formulas 1 to 3. Any alkali metal silicate satisfying the formulas is able to be used for the present invention.

The inorganic paint composition of the present invention further comprises phosphoric acid ($H_3PO_4$).

When the inorganic paint composition is coated on the surface of the basic material to form a coating film, since it includes the phosphoric acid, it increases the hydrophilic property by increasing a contact angle of water and the coating film. Preferably, the phosphoric acid included in the inorganic paint composition is 0.1~1 wt. % (based on 100 wt. % thereof). When the phosphoric acid is not within the range, it is difficult to obtain the expected effect resulting from the addition of the phosphoric acid.

The inorganic paint composition of the present invention comprises any one or more strong bases selected from KOH, NaOH, LiOH and LiOH. Preferably, the strong base(s) is 0.5~5 wt. % (that is, based on 100 wt. % of the inorganic paint composition). More preferably, it may be 1~3 wt. %. When the strong base(s) according to the preferred content is included in the inorganic paint composition, high reaction efficiency of the inorganic paint composition is obtained. In addition, the finally produced inorganic paint composition is better applied/coated and it is possible to prevent the inorganic paint composition from hardening upon preparation.

The inorganic paint composition is prepared to have a pH of 8~14, thereby obtaining desirable reaction efficiency and making it possible for the inorganic paint composition to be maintained in an optimum solution state.

The inorganic paint composition of the present invention may use a hydrophilic solvent (for example, water) as the solvent to mix the aforementioned ingredients. Water included as a typical hydrophilic solvent may be 4~84 wt. %, based on the total weight of the inorganic paint composition (that is, based on 100 wt. % of the inorganic paint composition). The water acting as the solvent also enhances the dispersibility and reaction efficiency of the alkali metal silicate.

The inorganic paint composition of the present invention may further use a pigment for providing a color to the coating film and an additive for improving the flexibility, adhesive property, impact-resistance and smoothness of the coating film.

The additive may be one or more selected from ethylene glycol, diethylene glycol, aluminum stearate, silica, zirconium silicate, calcium silicate, alkyl sulfonate metallic salt, polysiloxane denaturants, poly-oxyethylene sorbitan monostearate, and silane. The additive is used in the range of 0.1 to 2 wt. %, based on the total weight of the inorganic paint composition (that is, 100 wt. % of the inorganic paint composition), to obtain a desired effect.

The coating film formed by using the inorganic paint composition is 9H in pencil hardness measured according to the standard of ASTM D3363, 5B in adhesion measured according to the standard of ASTM D3359, and 30.7 degrees or less in a contact angle between the coating film and water after putting one drop of the water on the coating film.

The surface of the basic material on which the coating film is formed by the inorganic paint composition may not corrode after it is treated by using a 10% chloride acid solution for 12 hours or more (preferably, 48 hours or more).

When the inorganic paint composition is used to coat glass (for example, glass for a solar cell), reflectance of the coated glass decreases by 1~3% compared with that of uncoated glass and transmittance of the coated glass increases by 1~3% compared with that of the uncoated glass.

Hereinafter, the method for forming an inorganic paint film using the inorganic paint composition of the present invention will be described:

The method for forming an inorganic paint film comprises the steps of:

a) mixing and agitating at least one or more alkali metal silicates represented by Formulas 1 to 3 below; phosphoric acid ($H_3PO_4$); any one or more strong bases selected from KOH, NaOH and LiOH; and water ($H_2O$); b) preheating a basic material; c) coating a surface of the basic material with the inorganic paint composition; and d) performing plastic-working of the dried basic material.

$$x Na_2O \cdot y SiO_2 \cdot n H_2O \quad \text{[Formula 1]}$$

$$x K_2O \cdot y SiO_2 \cdot n H_2O \quad \text{[Formula 2]}$$

$$x Li_2O \cdot y SiO_2 \cdot n H_2O \quad \text{[Formula 3]}$$

In Formulas 1 to 3, x and y are 0.01~500, respectively, (preferably, a ratio of x and y is 1:1.9~500), and n is a natural number of 1~20.

The method for forming an inorganic paint film will be specifically described below:

In step a), the inorganic paint composition of the present invention is prepared by adding at least one or more alkali metal silicates represented by Formulas 1 to 3, phosphoric acid ($H_3PO_4$), any one or more strong bases selected from KOH, NaOH and LiOH, water ($H_2O$), and/or an additive (if needed) within the aforementioned ranges, into an agitator to be mixed.

At this time, preferably, an agitating speed is 150~40 RPM. When the agitating speed is less than 150 RPM, the inorganic paint composition is not sufficiently mixed. Even though the agitating speed exceeds 400 RPM, there is no big difference in agitating capability.

The inorganic paint composition may be prepared by simultaneously adding the constituent substances thereof altogether, to be agitated. However, it may be finally made by separately preparing two or more compositions and then agitating them again.

That is, the inorganic paint composition may be prepared by separately preparing a first composition comprising phosphoric acid ($H_3PO_4$), at least one or more alkali metal silicates represented by Formulas 1 to 3, a strong base(s) and water ($H_2O$) and a second composition comprising at least one or more alkali metal silicates represented by Formulas 1 to 3, a strong base(s) and water ($H_2O$), and then mixing and agitating the first composition and the second composition at a ratio of 1:1. In this case, a result of further improving pollution-resistance of the coating film is obtained.

The first composition may comprise: 0.1~1 wt. % of the phosphoric acid ($H_3PO_4$), 0.001~49 wt. % of the at least one or more alkali metal silicate represented by Formulas 1 to 3 above; 0.5~5 wt. % of the strong base; and 1~50 wt. % of the water ($H_2O$), based on 100 wt. % of the total inorganic paint composition.

The second composition may comprise: 12~69 wt. % of the at least one or more alkali metal silicate represented by Formulas 1 to 3 above; 0.5~5 wt. % of the strong base; and 1~85 wt. % of the water ($H_2O$), based on 100 wt. % of the total inorganic paint composition.

The method of preparing the first composition and the second composition and the method of finally preparing the inorganic paint composition by mixing the first and second compositions may use the same mixing and agitating methods described above.

As described above, when the inorganic paint composition is prepared, it is preferable to maintain a pH of 8~14, thereby obtaining desirable reaction efficiency and making it possible for the inorganic paint composition to be maintained in an optimum solution state.

After the inorganic paint composition is prepared, step b) of preheating the basic material at a predetermined temperature is preformed for coating.

In the step of preheating the basic material at the predetermined temperature, the basic material is preheated at about 50±10° C. such that the surface of the basic material is efficiently coated with the inorganic paint composition.

The basic material used in the present invention may use a diversity of materials including metals, nonferrous metals, plastics, ceramics, stones, tiles, etc. All of different basic materials to be coated with paints can be used.

Prior to step b), the method for forming an inorganic paint film of the present invention may further comprise a step of pre-treating the basic material and a step of cleaning the surface of the basic material by using any one of the ways of removing impurities, i.e., plasmatizing, anodizing, sanding, etching, and cleaning to remove grease from the surface of the basic material. These steps are to make the basic material so as to be hydrophilic and to be protected, so that the inorganic coating film is more efficiently formed.

The step of cleaning the surface of the basic material may use an ultrasonic cleaning step. In the ultrasonic cleaning step, the basic material is immersed into an ultrasonic tank filled with a water-soluble cleaner. Then, ultrasonic waves are generated to fully clean the surface of the basic material. Preferably, the ultrasonic waves may be 28~48 kHz. In the ultrasonic cleaning step, the water-soluble cleaner includes an inorganic salt. When the water-soluble cleaner including the inorganic salt is used, it increases adherence to the inorganic coating film formed on the surface of the basic material and forms the coating film with high hardness.

Prior to the ultrasonic cleaning step, a deposition and evaporation cleaning step to remove grease and impurities may be further performed. This step is not needed to be additionally performed when the surface of the basic material is clean. However, it is preferable to utilize this step when impurities are present on the surface of the basic material.

The deposition and evaporation cleaning step is to remove all sorts of grease, such as mineral synthetic oil attached to the surface of the basic material. The basic material is cleaned by depositing a solvent in a tank or the grease and impurities are cleaned by condensate water flowing on the surface of the basic material. The condensate water is made by evaporating a solvent and condensing steam. When the surface of the basic material is cleaned by the steam condensation, since the basic material is immediately dried as soon as it is out from the tank, any additional drying steps are not needed to proceed with a next step. Therefore, production time is reduced.

When the surface-treatment and preheat-treatment of the basic material are finished through the aforementioned steps, the step c) coating the surface of the basic material with the inorganic paint composition is performed.

A method of coating with an inorganic paint composition is not specifically limited and thus, publicly known methods may be used. For example, the surface of the basic material may be coated with the inorganic paint composition by using any one of the following methods: a dipping coating method, a spray coating method, a roll coating method, a spin coating method, a bar coating method, a flow coating method, a curtain coating method, a knife coating method, a vacuum deposition method, an ion plating method, a plasma deposition method, etc.

Preferably, the coating film formed on the surface of the basic material by using the inorganic paint composition may be 0.0130 ~30 μm in thickness. More specifically, the coating film can be formed to have a thickness of 0.015 ~5 μm by the dipping coating method or 0.110 ~10 μm by the spray coating method. All of the aforementioned coating methods are capable of controlling the coating thickness within the aforementioned ranges, depending on use.

In some cases, the coating step may be performed several times by using the same method, to form the coating film.

After the surface of the basic material is coated with the inorganic paint composition in the aforementioned step, step of d) plastic-working the basic material is performed at a predetermined temperature for a predetermined time, to completely harden the inorganic paint composition.

The step of plastic-working the dried basic material is performed, preferably, at 80° C. to 450° C. for 30 minutes to 3 hours in order to realize the hardness and smooth surface of the basic material without making any big impact on the basic material.

The plastic-working step may be performed by being divided into a first plastic-working process, a second plastic-working process and a cooling process.

Specifically, after the basic material with the coating film is put in a plastic-working furnace, an internal temperature of the plastic-working furnace is slowly increased. Once the internal temperature of the plastic-working furnace reaches a first plastic-working temperature, the temperature is maintained not to increase. The first plastic-working process is performed for a predetermined time while the internal temperature of the plastic-working furnace is maintained as the first plastic-working temperature. Preferably, the first plastic-working temperature is 80±60° C. Of course, an auxiliary plastic-working step may be further performed at a temperature which is lower than the first plastic-working temperature, by uniformly maintaining the temperature for 10 or more minutes.

When the first plastic-working process is completed, the internal temperature of the plastic-working furnace is again slowly increased. When the internal temperature of the plastic-working furnace reaches a second plastic-working temperature, the temperature is maintained not to increase. The second plastic-working process is performed for a predetermined time while the internal temperature of the plastic-working furnace is maintained as the second plastic-working temperature. Preferably, the second plastic-working temperature is 250±50° C. to 400±90° C.

Another auxiliary plastic-working step for auxiliary plastic-working may be further performed by uniformly maintaining the temperature between the first plastic-working temperature and the second plastic-working temperature for 10 or more minutes.

When the first and second plastic-working processes are completed, the cooling process is performed to cool the plastic-worked basic material to a room temperature. The cooling process is not to apply any special treatment to the basic material but to lower the temperature of the basic material to the room temperature. Like the first and second plastic-working processes, the cooling process may be performed in such a manner that the temperature is reduced to a predetermined temperature, the predetermined temperature is maintained for a predetermined time and then is again reduced.

Since a thermal expansion coefficient between the basic material and the coating film is different according to the kinds of basic materials, the plastic-working temperature may be differently selected to reduce a thermal shock by cooling.

Additionally, prior to the plastic-working step, a step of drying the basic material coated with the inorganic paint composition may be further performed at a room temperature or at a higher temperature for a predetermined time. For example, when the spray coating method is used to coat both sides, one side of the basic material is coated and dried for a certain time, then to coat the other side. A temperature and time are controlled based on the amount of water ($H_2O$) included in the coating composition, to improve productivity and to form the coating film on the optimum conditions, depending on an object to which the composition is applied.

By the method for forming an inorganic paint film of the present invention, the inorganic coating film using the inorganic paint composition of the present invention is formed on the surface of the basic material.

At this time, a phosphoric acid film having strong adhesion between the basic material and the coating film is formed in the coating film, and a hydrophilic OH monomolecular film is formed on the surface of the coating film.

The present invention further provides a method for forming an inorganic paint film by using microwaves.

In the case where microwaves are used to directly radiate an object, a problem may occur, depending on the materials of the object to be coated. Plastic-working is performed on such a material of the object having the problem, by using far-infrared rays and radiant heat which convert electromagnetic waves to the same natural rays and heat as the sun by using a chamber. At this time, a plastic-working furnace which is low-energy and low-price can be used. The chambers having different thicknesses are used or a time for radiating microwaves is controlled to control the temperature.

For the other purposes, the roll coating method, spray coating method or dipping coating method may be used, based on the shapes of films and substrates formed of polymer materials. In this case, it is possible to coat one side or two sides. A coating substance is applied to a polymer material and immediately the plastic-working by using microwaves is performed, thereby enabling the coating of the polymer material at different thicknesses. This makes it possible to keep all kinds of shapes and to use different characteristics of inorganic materials. Therefore, since the coating substance is directly applied to the industrial materials which have been already installed, the range of use is diversified.

In the method for forming an inorganic paint film using microwaves according to the present invention, when the waves having a frequency of 2,450 MHz are released from magnetrons, water molecules having a similar natural frequency change positive and negative directions, very quickly rotate and align in accordance with an electromag netic field, by a resonance phenomenon which is a property to absorb the waves or wave energy corresponding to the natural frequency. Molecules push and pull or collides one another by their rotation. Since this kinetic energy increases the temperature of the entire water mixed with the inorganic paint, the electric energy efficiently changes to the heat energy with almost no energy loss. Therefore, the microwaves are absorbed in the water mixed with the inorganic materials on the surface of the basic material, without affecting the basic material, to be converted into the heat energy, forming the film between the basic material and the inorganic paint composition.

The energy by the microwaves radiating from the magnetrons is absorbed only to the inorganic paint composition including the water. That is, since the energy of the waves is not absorbed in the air or any other different basic materials which are different in natural frequency, it is not heated and it heats only the water in the inorganic paint composition, thereby acting to form the inorganic film on the basic material.

In a plastic-working step by using the microwaves, when the microwaves are absorbed into the inorganic paint composition including the water, a kinetic state of atoms of the water is changed so that the atoms much faster move. As the atoms fast move, very high heat generates within a short time and this heat is used to significantly shorten a plastic-working time of the conventional method and to greatly increase the productivity.

Results of an evaluation test of the inorganic coating film formed by using the inorganic paint composition of the present invention will be described with reference to working examples and comparative examples below:

EXAMPLES

[Table 1] shows the composition ratios of the inorganic paint compositions (Examples 1 to 5) by simultaneously mixing and agitating altogether the constituting substances according to the present invention. [Table 2] shows the composition ratios of the inorganic paint compositions (Examples 6 to 8) by separately mixing and agitating two compositions. Sodium silicate hydrate ($Na_2OySiO_2nH_2O$) and potassium silicate hydrate ($K_2OySiO_2nH_2O$) used the products of Daejung Chemicals & Metals Co., Ltd. and lithium silicate hydrate ($Li_2OySiO_2nH_2O$) used the products of Young Il Chemical Co., Ltd.

TABLE 1

| | Raw Materials | Solids Content | Example 1 (wt. %) | Example 2 (wt. %) | Example 3 (wt. %) | Example 4 (wt. %) | Example 5 (wt. %) |
|---|---|---|---|---|---|---|---|
| Coating Solution | $H_3PO_4$ | 0.85 | 0.25 | 0.3 | 0.5 | 0.5 | 1.0 |
| | $Na_2O \cdot ySiO_2 \cdot nH_2O$ | 0.39 | 40 | 30 | 20 | 10 | 15 |
| | $K_2O \cdot ySiO_2 \cdot nH_2O$ | 0.28 | 5 | 10 | 15 | 15 | 5 |
| | $Li_2O \cdot ySiO_2 \cdot nH_2O$ | 0.22 | 20 | 30 | 40 | 40 | 15 |
| | KOH | 0.95 | 0.5 | 0.5 | 0.75 | 1.0 | 0.5 |
| | Poly-oxyethylene Soritan Monostearate | — | 0.05 | 0.05 | 0.05 | 0.05 | 0.05 |
| | $H_2O$ | 0 | 34.2 | 29.15 | 23.7 | 33.45 | 63.45 |
| | Total weight % | — | 100 | 100 | 100 | 100 | 100 |

TABLE 2

| | Raw Materials | Example 6 (wt. %) | Example 7 (wt. %) | Example 8 (wt. %) |
|---|---|---|---|---|
| First Composition | $H_3PO_4$ | 0.5 | 0.5 | 0.25 |
| | $Na_2O \cdot ySiO_2 \cdot nH_2O$ | — | 10 | — |
| | $K_2O \cdot ySiO_2 \cdot nH_2O$ | — | — | — |
| | $Li_2O \cdot ySiO_2 \cdot nH_2O$ | 30 | — | — |
| | KOH | 0.1 | 0.25 | 0.1 |
| | Poly-oxyethylene Soritan Monostearate | 0.02 | 0.02 | 0.02 |
| | $H_2O$ | 19.38 | 39.23 | 49.63 |
| Second Composition | $Na_2O \cdot ySiO_2 \cdot nH_2O$ | 20 | 15 | 15 |
| | $K_2O \cdot ySiO_2 \cdot nH_2O$ | 15 | 10 | 5 |
| | $Li_2O \cdot ySiO_2 \cdot nH_2O$ | 10 | 5 | 20 |
| | KOH | 0.75 | 0.75 | 0.5 |
| | Poly-oxyethylene Soritan Monostearate | 0.03 | 0.03 | 0.03 |
| | $H_2O$ | 4.22 | 19.22 | 9.47 |
| | Total weight % | 100.0 | 100.0 | 100.0 |

The coating films were formed by coating stainless steel substrates with the inorganic paint compositions prepared according to Examples 1 to 8 by the dipping coating method and by performing the plastic-working thereof at 250° C. for 2 hours. An evaluation test of the inorganic coating films (Examples 1 to 8) was performed by the methods described below, and the results are shown in [Table 4].

The inorganic paint compositions (according to [Table 3] showing its composition ratios) were prepared by separately adding sodium silicate hydrate, potassium silicate hydrate and lithium silicate hydrate one by one. The coating films were formed by coating the stainless steel substrate with the inorganic paint compositions prepared according to Example 9 to 11 by the dipping coating method and by performing the plastic-working at 250° C. for 2 hours. An evaluation test of the inorganic coating films (Examples 9 to 11) was performed by the methods described below, and the results are shown in [Table 4].

TABLE 3

| | Raw Materials | Solid Content | Example 9 (wt. %) | Example 10 (wt. %) | Example 11 (wt. %) |
|---|---|---|---|---|---|
| Coating Solution | $H_3PO_4$ | 0.85 | 0.25 | 0.3 | 0.5 |
| | $Na_2O \cdot ySiO_2 \cdot nH_2O$ | 0.39 | 55 | — | — |
| | $K_2O \cdot ySiO_2 \cdot nH_2O$ | 0.28 | — | 55 | — |
| | $Li_2O \cdot ySiO_2 \cdot nH_2O$ | 0.22 | — | — | 55 |
| | KOH | 0.95 | 0.5 | 0.5 | 0.75 |
| | Poly-oxyethylene Soritan Monostearate | 0 | 0.05 | 0.05 | 0.05 |
| | $H_2O$ | 0 | 44.2 | 44.15 | 43.7 |
| Total weight % | | — | 100.0 | 100.0 | 100.0 |

Figure 4:
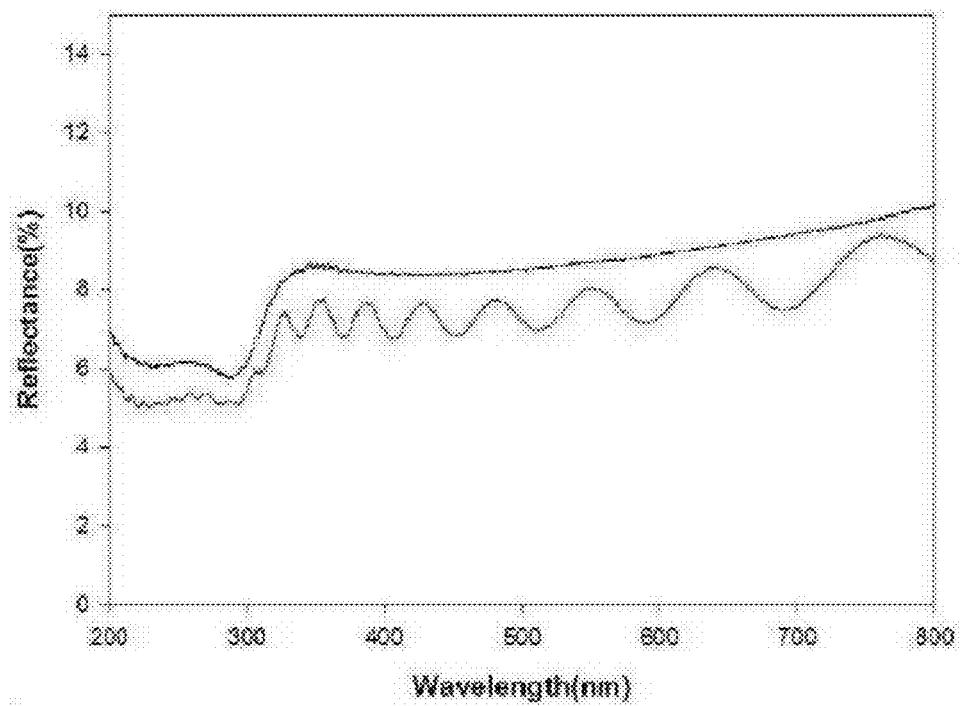
FIG. 4 is a graph showing results of measuring the light reflectance of working example 12 (red line) of the present invention and comparative Example 2 (black line)
Figure 5:
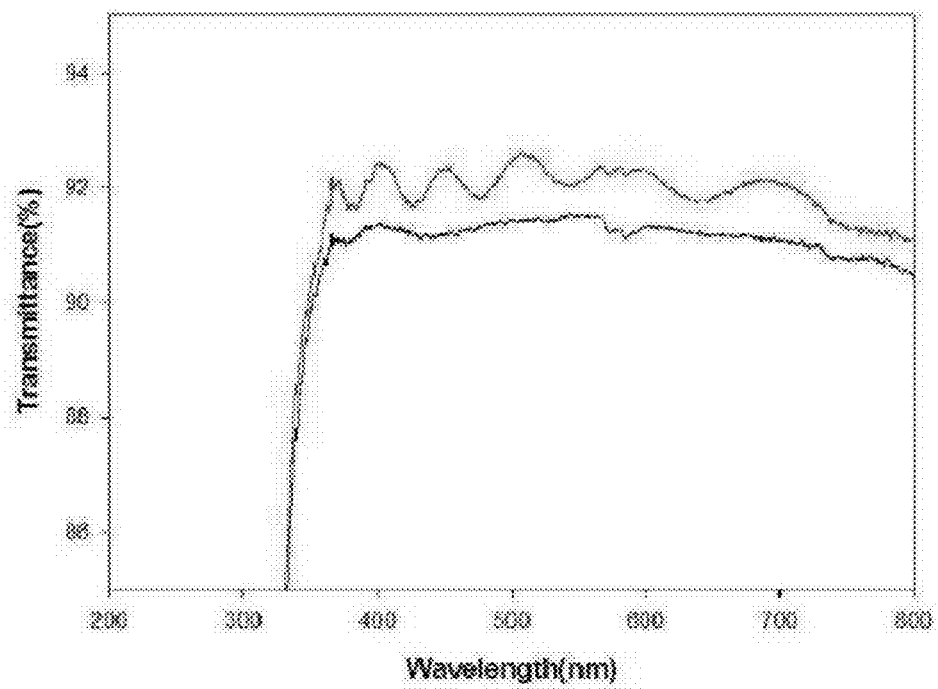
FIG. 5 is a graph showing results of measuring the light transmittance of working example 12 (red line) of the present invention and comparative Example 2 (black line)

A glass substrate was coated with the inorganic paint composition according to Example 1 by the dipping coating method. The plastic-working thereof was performed at 250° C. for 2 hours (Example 12). Results of measuring the reflectance and transmittance thereof are shown in the graphs of FIG. 4 and FIG. 5.

Comparative Example 1

Figure 2:
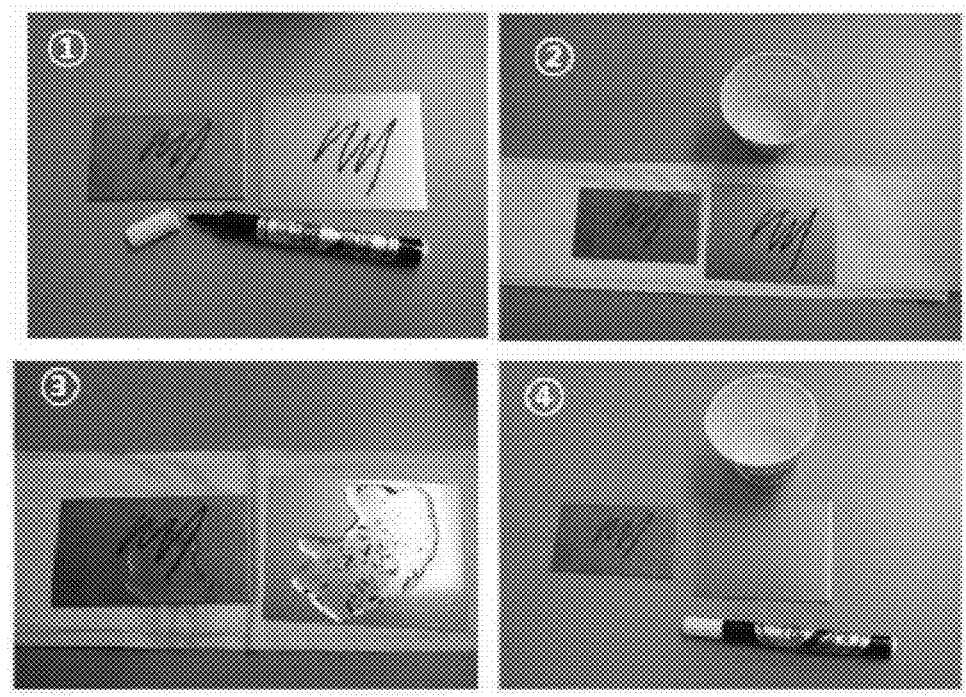
FIG. 2 shows the results of a pollution-resistance test on the surface of the basic material with the inorganic coating film.
Figure 3:
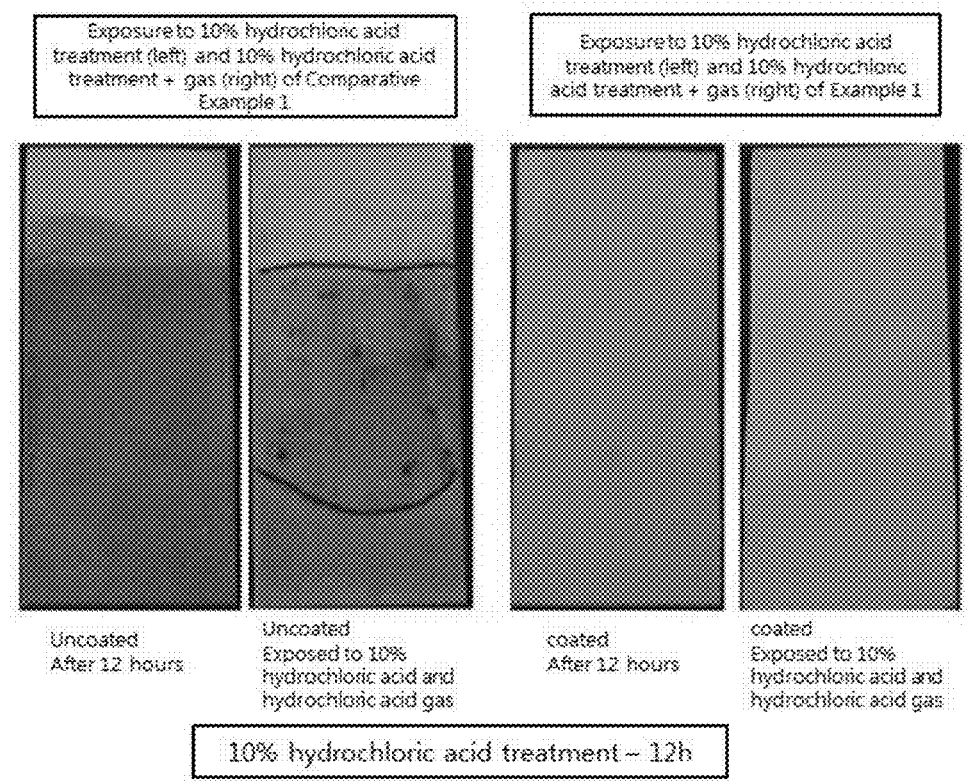
FIG. 3 shows the results of a corrosion-resistance test on the surface of the basic material with each inorganic coating film in working example and comparative example.

An evaluation test for the illumination intensity and pollution-resistance of a stainless steel substrate which was not coated with the inorganic paint composition was performed by the methods described below and the results are shown in FIG. 1 and FIG. 2.

Comparative Example 2

The results of an evaluation test for the illumination intensity and pollution-resistance of a glass substrate which was not coated with the inorganic paint composition are shown in FIG. 4 and FIG. 5.

Evaluation Methods

1. Pencil Hardness

The hardness was measured according to the standard of ASTM D3363.

A pencil for measurement was placed and a predetermined load (1 Kg) was applied. The measurement results were indicated as 9H~1H, F, HB, and 1B~6B. 9H indicates the hardest hardness and 6B indicates the weakest hardness.

2. Adhesion or Adherence

The adhesion was measured according to the standard of ASTM D3359.

A checkerboard shape was made on the coating film using the inorganic paint composition by using a cutter. The 3M tape was completely attached to the checkerboard-shaped cut and then the tape was removed by pulling it off with a constant force, to observe the degree of attachment between the coating film and the substrate. The measurement results were indicated as 0B, 1B, 2B, 3B, 4B and 5B.

0B: 65% or more loss of the coating film after the adhesion test

1B: about 35~65% loss of the coating film after the adhesion test

2B: about 15~35% loss of the coating film after the adhesion test

3B: about 5~15% loss of the coating film after the adhesion test

4B: less than 5% loss of the coating film after the adhesion test

5B: no loss of the coating film after the adhesion test

3. Pollution-Resistance

After the coating film was marked-up by using an oil marker and then water (tap water) was sprayed thereon, the extent that the stain of the marker was removed was measured. This measurement was repeatedly performed by 10 times and the results were indicated as ⊚: Very good, ○: Good, Δ: Normal, and X: Bad.

4. Contact Angle

After dropping a drop of water on the coating film, the shape of the water on the coating film changed was observed. This was a test to know the extent of hydrophilic properties of the coating film. When the coating film is super-hydrophilic or hydrophilic, the pollution-resistance is better. When the contact angle is 20±5 degrees, it is considered as being hydrophilic, and when the contact angle is 10±2 degrees, it is considered as being super-hydrophilic.

5. Heat-Resistance

After the basic material was placed at 90° C. for 12 hours, the state of the coating film was measured.

6. Transmittance

The transmittance of the coating film coated on the glass substrate from a visible ray region to an ultraviolet ray region was measured by the UV-Visible Spectrometer.

7. Reflectance

The reflectance of the coating film coated on the glass substrate from a visible ray region to an ultraviolet ray region was measured by the UV-Visible Spectrometer.

TABLE 4

| | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Pencil Hardness | 9H | 9H | 9H | 9H | 9H | 9H | 9H | 9H | 9H | 9H | 9H |
| Adhesion (adherence) | 5B | 5B | 5B | 5B | 5B | 5B | 5B | 5B | 4B | 4B | 4B |
| Pollution-resistance | ○ | ⊚ | ⊚ | ⊚ | ⊚ | ⊚ | ○ | ○ | Δ | Δ | X |

TABLE 4-continued

| | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Contact Angle | 23.2 hydrophilic | 20.7 hydrophilic | 12.4 super-hydrophilic | 9.3 super-hydrophilic | 7.8 super-hydrophilic | 4.7 super-hydrophilic | 28.8 hydrophilic | 30.7 | 35.2 | 38.7 | 43.2 |
| Heat Resistance | Not melt | Not melt | Not melt | Not melt | Not melt | Not melt | Not melt | Not melt | Melt | Melt | Melt |

The present invention also relates to the method for forming an inorganic paint film. More specifically, the film coated by using the inorganic paint is formed by using the microwaves. The method for forming an inorganic paint film is to form the inorganic paint film which is excellent in adherence to the basic material and in characteristics of the film by the chemical and physical changes generated in the plastic-working process. The method for forming an inorganic paint film according to the present invention improves the productivity by shortening the production time, regardless of the kinds of the basic materials. It also hardens the inorganic film by using the microwaves, regardless of the melting points of the basic materials formed of polymer materials, organic, or organic and inorganic composite materials. Therefore, hardening is possible in a very short time, without deforming the surface of the basic material by heat. Further, the method for forming an inorganic paint film is effectively used for forming the films of various inorganic paints. The hardness of the paint film is high and the smoothness of the surface of the film is excellent.

To achieve the aforementioned objects, the present invention provides a method for forming a low-temperature inorganic paint composition on a surface of a basic material, which comprises:

a step of mixing and agitating an inorganic paint composition;

a step of coating a surface of a basic material with the inorganic paint composition; and a step of performing plastic-working by radiating microwaves to the basic material coated with the inorganic paint composition.

The inorganic paint composition comprises: at least one or more alkali metal silicates represented by Formulas 1 to 3 below; phosphoric acid ($H_3PO_4$); any one or more strong bases selected from KOH, NaOH and LiOH; and water ($H_2O$), $$xNa_2O \cdot ySiO_2 \cdot nH_2O \quad \text{[Formula 1]}$$

$$xK_2O \cdot ySiO_2 \cdot nH_2O \quad \text{[Formula 2]}$$

$$xLi_2O \cdot ySiO_2 \cdot nH_2O \quad \text{[Formula 3]}$$

In Formulas 1 to 3, x and y are 0.01~500, respectively, (preferably, a ratio of x and y is 1:1.9~500), and n is a natural number of 1~20.

In the method for forming an inorganic paint film according to the present invention, after the inorganic paint composition is applied to the basic material where the inorganic paint film is to be formed, regardless of the kinds of basic materials, the plastic-working is performed by using microwave energy. Therefore, the plastic-working is processed more rapidly with less energy, compared with the conventional plastic-working process.

The microwave of about 2,450 MHz which is same as the frequency of a general microwave range is used to reach the temperature which is able to rapidly perform the plastic-working of only the inorganic paint applied to the basic material. Therefore, it is possible to perform the plastic-working of the desired inorganic paint in the basic material in a very short time.

In the case where a heating element, such as the conventional oven, etc., is used, this method according to the present invention enables the plastic-working of the material wherein it is impossible to perform plastic-working at a high temperature for a long time due to the material properties of the object to be coated. In the case where microwaves cannot be used in the basic material, this method of the present invention is used in the manner that the plastic-working is performed by using an indirect heating element in the form of a chamber, regardless of the kinds of basic materials. In the case where the object to be coated is a structure installed in the site where the basic material cannot be put in the plastic-working furnace or it is difficult to move the basic material, the plastic-working is performed by using a portable microwave radiator.

Additionally, the method for forming an inorganic paint film according to the present invention is used as a method for forming a thin film to have a uniform thickness and excellent optical and electrical characteristics. This method is to efficiently and rapidly process the inorganic paint composition on the basic material which is weak in heat-resistance, such as an organic or polymer film.

The method of forming an inorganic paint film according to the present invention further comprises: a step of performing a predetermined pretreatment on the surface of the basic material before coating. This is to protect the basic material and to efficiently form the film.

In the pretreatment step, it is preferable to perform a process for improving the attraction between the inorganic paint composition and the basic material by treating the surface of the basic material by performing a plasma surface treatment, anodizing or etching and a process for cleaning to remove grease on the surface of the basic material, to remove foreign substance and therefore to enhance the plastic-working process of the coating materials.

Further, in the present invention, a process for preheating the basic material at 60±30° C. is further performed before and after coating the inorganic paint composition onto the surface of the basic material, to make it easy to perform the plastic-working of the inorganic paint film, to prevent the generation of bubbles formed by the evaporation of water due to a high temperature for a short time, and to increase a degree of completion of the plastic-working.

Further, in the present invention, it is preferable to form the film in a thickness of 0.01~50 μm, considering that particles of the inorganic paint composition are nano-size.

The inorganic paint film may be formed by UV (ultraviolet) hardening, depending on the kinds of basic materials. The inorganic paint film may be also formed by mixing microwave and UV (ultraviolet) hardening, to increase the degree of completion of the plastic-working so that the hardness and adhesion increase and the film is more efficiently formed.

The method for forming an inorganic paint film according to the examples of the present invention is to firmly coat the surface of the basic material with the inorganic paint and to perform the polymer materials and composite materials are weak can be very highly maintained and it is possible to have the general characteristics of the inorganic materials, such as super-hydrophilic properties, corrosion-resistance, incombustibility, chemical resistance, antibiotic action, etc.

Figure 6:
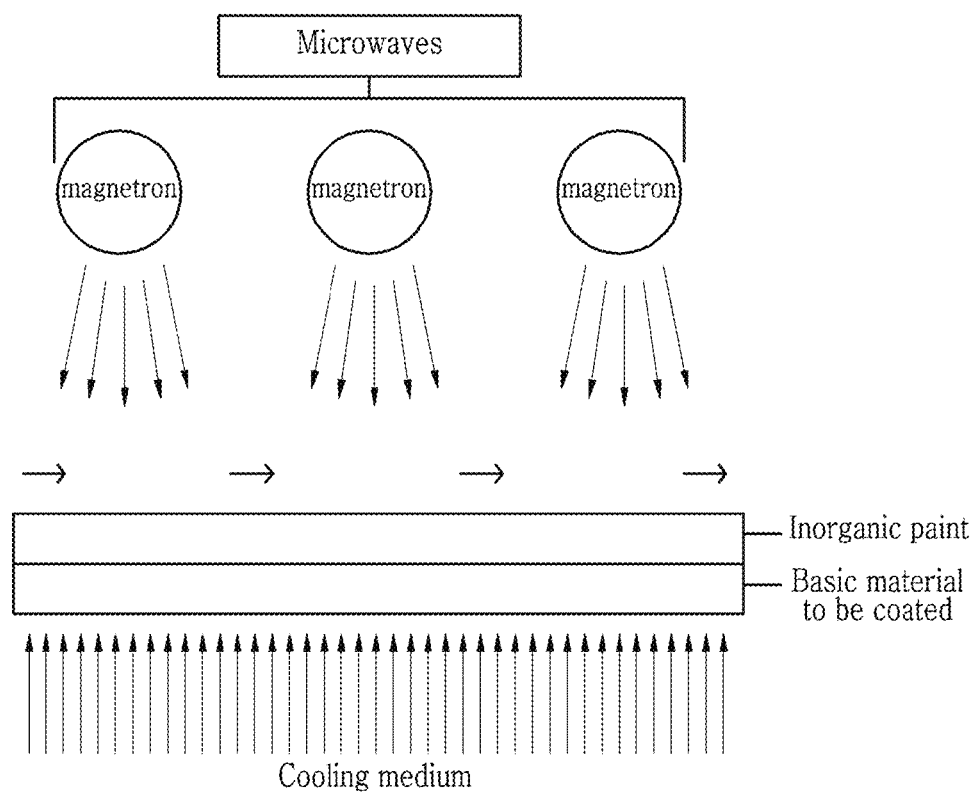
FIG. 6 is a schematic view of a method for forming an inorganic paint film according to the present invention.
Figure 7:
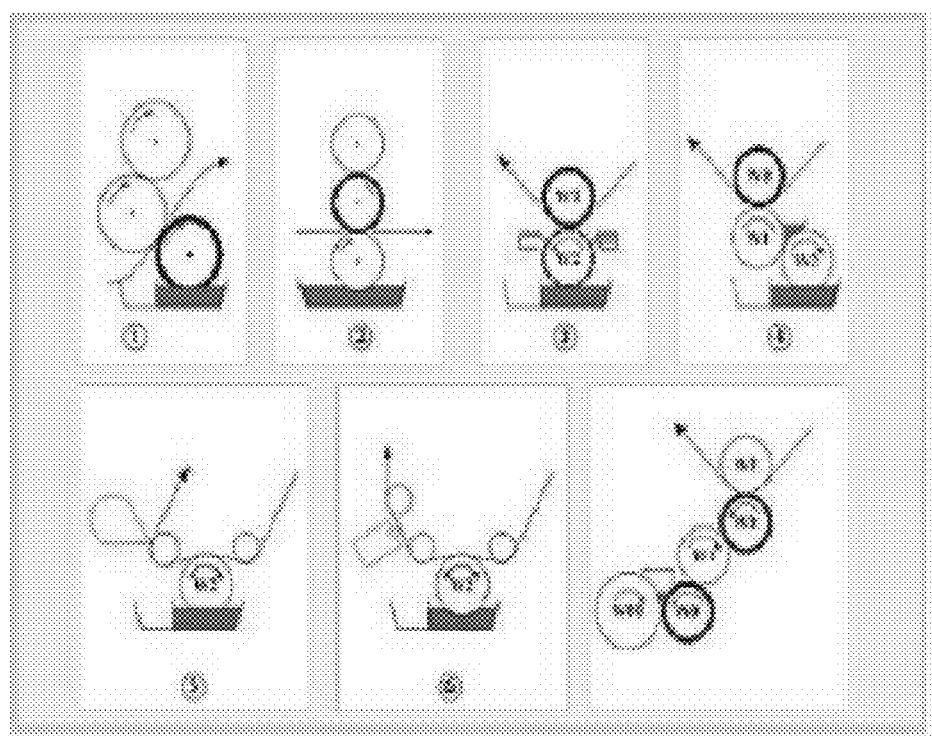
FIG. 7 shows schematic views of a roll-coating method using the inorganic paint composition in various examples.

FIG. 6 is a process view to illustrate each process in the method for forming an inorganic paint film according to another example of the present invention.

A pretreatment process to the surface of the basic material is performed. If the surface of the basic material is clean and not contaminated, this process may not be needed. But, the pretreatment process of the surface of the basic material is performed to obtain a better coating film.

The pretreatment process may include a grease-removing and cleaning process to remove impurities on the surface of the basic material. That is, when any foreign substances are present on the surface of the basic material, coating on that spot may be irregular and the surface of the basic material may be not smooth and uneven.

The pretreatment process on the surface of the basic material may also include a plasma surface treatment, anodizing or etching. This pretreatment process is to easily coat the surface of the basic material with the inorganic paint by forming a specific shape or making the surface of the basic material so as to be hydrophilic. The pretreatment process may further include a sending process to remove impurities.

Next, a preheat treatment process (P120) is performed. That is, this is to heat the basic material at a predetermined temperature. In the example, the basic material is preheated at about 60±30° C. Preheating before coating is to efficiently coat the surface of the basic material with the inorganic paint composition. Preheating after coating may be performed to prevent the generation of bubbles caused since the plastic-working is performed at a high temperature and for a very short time by using microwaves.

Figure 8:
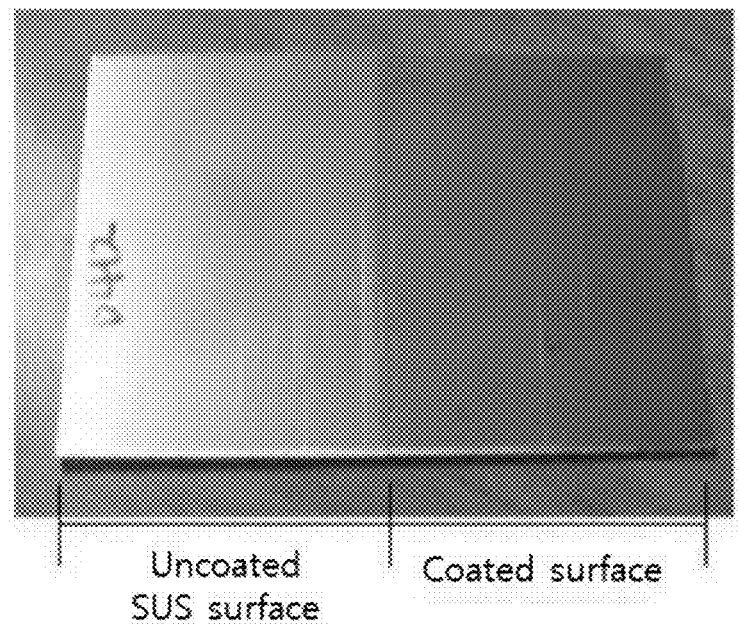
FIG. 8 are pictures of stainless steel surfaces in comparative example 1 (non-coated SUS surface) and working example (coated surface)
Figure 9:
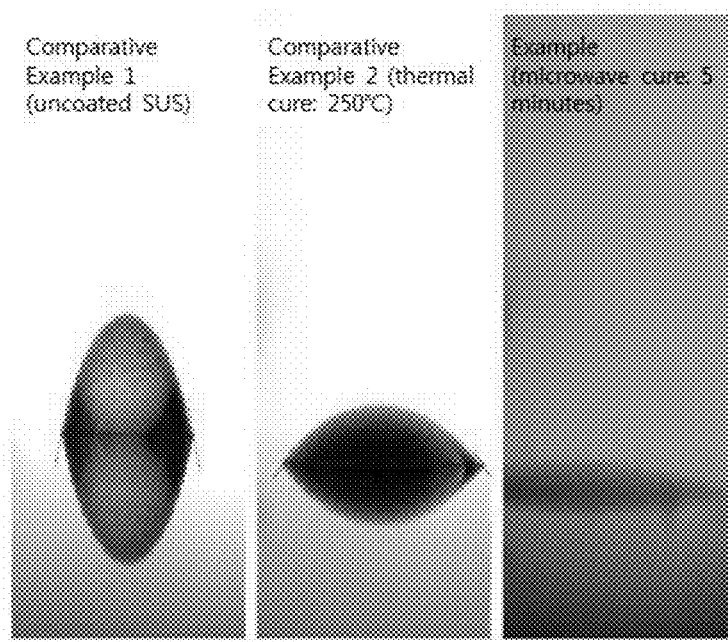
FIG. 9 shows SEM pictures of a contact angle of water on the inorganic films on the surfaces in comparative examples and working example.

When coating is performed by using the method for forming the inorganic paint film of the present invention and using the hydrophilic inorganic paint, a paint film 10 is formed as shown in FIG. 8. That is, a phosphoric acid film 30 having strong adhesion between a basic material 20 and the paint film 10 is formed. An OH monomolecular film having the hydrophilic properties is formed on the surface of the paint film 10 as shown in FIG. 9.

When the hydrophilic inorganic paint composition is used, it is preferable to perform the step of mixing and agitating the inorganic paint composition.

The hydrophilic inorganic paint composition as mentioned above will be described below:

Preferably, the hydrophilic inorganic paint composition is formed of alkali silicate (chemical formula: $M_2O \cdot nSiO_2 \cdot nH_2O$, is alkali metal) and alkali metal oxide.

More specifically, the inorganic paint composition.

The alkali metal silicates included in the present invention are represented by Formulas 1 to 3 below:

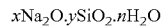  [Formula 1]

  [Formula 2]

  [Formula 3]

In Formulas 1 to 3, x and y are 0.01~500, respectively, (preferably, a ratio of x and y is 1:1.9~500), and n is a natural number of 1~20.

As shown in Formulas 1 to 3, the alkali metal silicate is composed of a complex compound. That is, it is a chemical species formed by combining some nonmetallic atoms or atomic groups around one or more atoms of lithium, sodium and potassium. A nonmetallic element is substituted for a central metal atom, so that a single bond between silicon (Si) and another atom is made as a double bond, generating a network structure. This is a mechanism in that hydroxyl ion (—OH) attached to silicate is substituted and dissociated as an ion by a condensation reaction with the silicate, thereby preventing the penetration of water and improving water-resistance.

The alkali metal silicates represented by Formulas 1 to 3 of the present invention are liquid materials, that is, sodium silicate hydrate, potassium silicate hydrate and lithium silicate hydrate.

The solids content included in the alkali metal silicate hydrates represented in Formulas 1 to 3 may be 25~50%, 15~40% and 10~35%, respectively.

Since the inorganic paint composition includes the alkali metal silicate hydrates which are in the ranges of the solids content as described above, it has fast and high reaction efficiency with the other constituent elements upon preparation. This is also preferable in view of stability even after the preparation.

The inorganic paint composition may comprise all of the sodium silicate hydrate, potassium silicate hydrate and lithium silicate hydrate represented by Formulas 1 to 3. That is, the inorganic paint composition of the present invention may comprise all of the silicate hydrates represented by Formulas 1 to 3, thereby increasing the adhesion or adherence to the basic material and improving dirt-resistance and water-resistance of the film coated by using the inorganic paint composition.

The alkali metal silicate of the inorganic paint composition according to the present invention may be 25~95 wt. %, based on the total weight of the inorganic paint composition.

When the inorganic paint composition includes the alkali metal silicate in the range of less than 25 wt. %, it is impossible to obtain any desirable effects in the capability of removing contaminating substances, hardness and corrosion-resistance of the inorganic paint composition. When the inorganic paint composition includes the alkali metal silicate in the range of more than 95 wt. %, it may have a problem in the adhesion or adherence to the basic material.

Further, the alkali metal silicate may comprise 12~40 wt. % sodium silicate hydrate of Formula 1, 1~15 wt. % potassium silicate hydrate of Formula 2, and 12~40 wt. % lithium silicate hydrate of Formula 3.

In the case where the composition ratios in Formulas 1 to 3 forming the alkali metal silicates fall within the aforementioned ranges, the effects of the present invention are greatly improved in the adherence to the basic material, corrosion-resistance, dirt-resistance, high hardness, heat-resistance, etc. However, when the amount of added water is less than the preferred content thereof, a crack may occur in the film of the inorganic paint composition formed on the surface of the basic material.

The present invention does not specially limit the method for preparing the alkali metal silicate hydrates represented by Formulas 1 to 3. Any alkali metal silicates satisfying the formulas can be used for the present invention.

The inorganic paint composition of the present invention further comprises phosphoric acid ($H_3PO_4$).

When the phosphoric acid is included in the inorganic paint composition to coat the surface of the basic material and to form the coating film, it increases the hydrophilic properties by increasing a contact angle of the water and the coating film. Preferably, the phosphoric acid is 0.1~1 wt. % in the inorganic paint composition. When the phosphoric acid is not within the range, it is difficult to obtain the expected effect resulting from the addition of the phosphoric acid.

The inorganic paint composition of the present invention comprises any one or more strong bases selected from KOH, NaOH, LiOH and LiOH. Preferably, the strong base(s) is 0.5~5 wt. %. More preferably, it may be 1~3 wt. %. When the strong base(s) according to the preferred content is included in the inorganic paint composition, high reaction efficiency of the inorganic paint composition is obtained. In addition, the finally produced inorganic paint composition is better applied/coated and it is possible to prevent the inorganic paint composition from hardening upon its preparation.

The inorganic paint composition is prepared to have a pH of 8~14, thereby obtaining desirable reaction efficiency and making it possible for the inorganic paint composition to be maintained in the optimum solution state.

The inorganic paint composition of the present invention may use a hydrophilic solvent, such as water, as the solvent to mix the aforementioned ingredients. Water which is a typical hydrophilic solvent may be 4~84 wt. %, based on the total weight of the inorganic paint composition (that is, based on 100 wt. % of the inorganic paint composition). The water acting as the solvent also enhances the dispersibility and reaction efficiency of the alkali metal silicate.

The inorganic paint composition of the present invention may further use a pigment for providing a color to the coating film and additives for improving the flexibility, adhesive property, impact-resistance and smoothness of the coating film.

The additive may be one or more selected from ethylene glycol, diethylene glycol, aluminum stearate, silica, zirconium silicate, calcium silicate, alkyl sulfonate metallic salt, polysiloxane denaturants, poly-oxyethylene sorbitan monostearate, and silane. The additive is used in the range of 0.1 to 2 wt. %, based on the total weight of the inorganic paint composition, to obtain a desired effect.

In the method for forming an inorganic paint film according to the present invention, the coating step is completed by performing the plastic-working using microwaves after applying the inorganic paint. Since microwaves are harmful to a human body, it is necessary for a worker to wear special clothes reflecting the microwave, to prevent it from reaching the worker when it is reflected to the basic material or it radiates from the magnetron. Further, it is necessary to manufacture a portable plastic-working device using the microwaves in a special form such that the microwaves are properly directed to the surface of the basic material to be coated.

Further, in the case where the plastic-working of the materials, such as polymer materials, needs to be performed at about 100° C., it needs to be performed by using a method of minimizing a thermal shock on the basic material formed of polymer materials by controlling the intensity of outputting the microwaves or by intermittently radiating the microwaves at intervals of a number of seconds or a number of minutes during the plastic-working process. It is necessary to perform the optimum plastic-working by processing such that the temperature of the surface of the basic material is not transferred to the basic material by cooling the bottom of the basic material.

When the cooling is needed depending on the kinds of basic materials, a step is needed to minimize the shock by heat to the basic material upon the plastic-working by using microwaves. This step is performed by air-cooling the bottom of the basic material to which the microwaves radiate, or, upon roll coating, it is performed by cooling by using a cooling substance inside the roll where the microwaves radiate. Specifically, in the case where the basic material is in the form of a film, the inorganic paint film is formed on the film, without directly forming the inorganic paint film on the basic material, such as glass or steel material. This inorganic paint film is directly attached to the existing industrial materials including glass, to obtain the effect of directly forming the inorganic paint film on the basic material such as glass or steel material. Further, it is possible to attach the film to the surface of the existing solar cell, thereby improving the output of the solar cell. Therefore, it can be applied for various uses.

In the case where the plastic-working is performed by using microwaves, it is performed by the water being mixed with the inorganic raw materials. Therefore, the amount of the water is controlled to optimize the plastic-working Controlling the amount of the water is to adhere the inorganic raw materials to the basic material and to preheat and dry the inorganic raw materials at a room temperature or at a higher temperature for the optimum plastic-working conditions.

The method for forming an inorganic paint film according to the present invention will be described with reference to the example and comparative examples below:

EXAMPLE

The inorganic paint composition was prepared by mixing and agitating 40 wt. % sodium silicate hydrate ($Na_2OySiO_2nH_2O$) and 5 wt. % potassium silicate hydrate ($K_2OySiO_2nH_2O$), both being the products of Daejung Chemicals & Metals Co., Ltd., and 20 wt. % lithium silicate hydrate ($Li_2OySiO_2nH_2O$) as the products of Young Il Chemical Co., Ltd., 0.25 wt. % phosphoric acid, 0.5 wt. % NaOH, 0.005 wt. % poly-oxyethylene sorbitan monostearate as an additive, and 34.2 wt. % water. The surface of stainless (SUS) was coated with the inorganic paint composition by the dipping coating method. After the coating, plastic-working was performed for 5 minutes by using microwaves with 2,450 MHz in frequency. An evaluation of function, an extent of surface coating (FIG. 8) and a contact angle of water on the inorganic paint film (FIG. 9) were measured, and the results are shown in Table 5, FIG. 8 and FIG. 9.

Comparative Example 1

Stainless steel which was not coated with the inorganic paint composition of the aforementioned Example was measured with respect to the material properties, the extent of surface coating, and the contact angle of water on the surface thereof, and the results are shown in Table 5, FIG. 8 and FIG. 9.

Comparative Example 2

This comparative example made an SUS with an inorganic paint film formed by the same method as the example excepting that the plastic-working was performed at 250° C. without using microwaves.

Evaluation Methods

1. Pencil hardness

The hardness was measured according to the standard of ASTM D3363.

A pencil for measurement was placed and a predetermined load (1 Kg) was applied. The measurement results were indicated as 9H~1H, F, HB, and 1B~6B. 9H indicates the hardest hardness and 6B indicates the weakest hardness.

2. Adhesion or adherence

The adhesion was measured according to the standard of ASTM D3359.

A checkerboard shape was made on the coating film using the inorganic paint composition by using a cutter. The 3M tape was completely attached to the checkerboard-shaped cut and then the tape was removed by pulling it off with a constant force, to observe the degree of attachment between the coating film and the substrate. The measurement results were indicated as 0B, 1B, 2B, 3B, 4B and 5B.

0B: 65% or more loss of the coating film after the adhesion test

1B: about 35~65% loss of the coating film after the adhesion test

2B: about 15~35% loss of the coating film after the adhesion test

3B: about 5~15% loss of the coating film after the adhesion test

4B: less than 5% loss of the coating film after the adhesion test

5B: no loss of the coating film after the adhesion test

3. Pollution-resistance

After the coating film was marked-up by using an oil marker and then water (tap water) was sprayed thereon, the extent that the stain of the marker was removed was measured. This measurement was repeatedly performed by 10 times, and the results were indicated as ⊚: Very good, ○: Good, Δ: Normal, and X: Bad.

4. Contact Angle

After dropping a drop of water on the coating film, how the shape of the water on the coating film changed was observed. This was a test to know the extent of hydrophilic properties of the coating film. When the coating film is super-hydrophilic or hydrophilic, the pollution-resistance is better. When the contact angle is 20±5 degrees, it is considered as being hydrophilic, and when the contact angle is 10±2 degrees, it is considered as being super-hydrophilic.

5. Heat-Resistance

After the basic materials of Examples 1~8 and Comparative Example 1 were placed at 90° C. for 12 hours, the states of the coating films were measured.

TABLE 5

|  | Comparative Example 1 | Comparative Example 2 | Example |
|---|---|---|---|
| Pencil Hardness | HB | 9H | 9H |
| Adhesion or adherence | n/a | 5B | 5B |
| Pollution-Resistance | X | | |
| Contact Angle | 53.0 | 23.2 hydrophilic | under 10 degrees super-hydrophilic |
| Heat-Resistance | n/a | Not melt | Not melt |

What is claimed is:

1. An inorganic paint composition comprising:
at least one or more alkali metal silicates represented by Formulas 1 to 3;
phosphoric acid ($H_3PO_4$);
any one or more bases selected from KOH, NaOH and LiOH; and
water ($H_2O$),
wherein Formula 1 is $xNa_2O \cdot ySiO_2 \cdot nH_2O$,
wherein Formula 2 is $xK_2O \cdot ySiO_2 \cdot nH_2O$,
wherein Formula 3 is $xLi_2O \cdot ySiO_2 \cdot nH_2O$,
wherein, in Formulas 1 to 3, x and y are 0.01~500, respectively and n is a natural number of 1~20, and
wherein the at least one or more alkali metal silicates represented by Formulas 1 to 3 above is 25~95 wt. %, the phosphoric acid (H3PO4) is 0.1~1 wt. %, the base(s) is 0.5~5 wt. %; and the water (H2O) is 4~84 wt. %, based on 100 wt. % of the inorganic paint composition.

2. The inorganic paint composition according to claim 1, wherein the alkali metal silicates represented by Formulas 1 to 3 are 12~40 wt. %, 1~30 wt. % and 12~40 wt. %, respectively, based on 100 wt. % of the inorganic paint composition.

3. The inorganic paint composition according to claim 1, wherein the alkali metal silicates represented by Formulas 1 to 3 include 25~50%, 15~40% and 10~35% of solids content, respectively.

4. The inorganic paint composition according to claim 1, wherein the inorganic paint composition has a pH of 8~14.

5. The inorganic paint composition according to claim 1, wherein a coating film formed by the inorganic paint composition is 9H in pencil hardness, 5B in adhesion, and 10.0 degrees or less in a contact angle.

6. The inorganic paint composition according to claim 1, wherein a surface of a basic material where a coating film of the inorganic paint composition is formed is not corroded after the surface of the basic material is exposed to an acid of 10% in concentration for 0.01~300 hours.

7. The inorganic paint composition according to claim 1, wherein a reflectance of glass coated with the inorganic paint composition decreases by 1~3% compared with uncoated glass, and a transmittance of the coated glass increases by 1~3% compared with the uncoated glass.

* * * * *